United States Patent
Yun et al.

(10) Patent No.: US 9,360,520 B2
(45) Date of Patent: Jun. 7, 2016

(54) TEST MODE CONTROL CIRCUIT OF SEMICONDUCTOR APPARATUS AND CONTROL METHOD THEREOF

(75) Inventors: Tae Sik Yun, Ichon-shi (KR); Jong Chern Lee, Ichon-shi (KR)

(73) Assignee: SK HYNIX INC., Icheon-Si (KR)

( * ) Notice: Subject to any disclaimer, the term of this patent is extended or adjusted under 35 U.S.C. 154(b) by 1296 days.

(21) Appl. No.: 13/181,921

(22) Filed: Jul. 13, 2011

(65) Prior Publication Data
US 2012/0119764 A1 May 17, 2012

(30) Foreign Application Priority Data
Nov. 17, 2010 (KR) .................. 10-2010-0114405

(51) Int. Cl.
| H03K 19/00 | (2006.01) |
| G01R 31/317 | (2006.01) |
| G11C 29/14 | (2006.01) |
| G11C 29/46 | (2006.01) |
| G11C 29/00 | (2006.01) |

(52) U.S. Cl.
CPC .......... G01R 31/31724 (2013.01); G11C 29/14 (2013.01); G11C 29/46 (2013.01); *G11C 29/78* (2013.01); *G11C 29/802* (2013.01)

(58) Field of Classification Search
CPC ................ G01R 31/31724; G01R 31/318416; G01R 31/318541; G11C 29/14
USPC .............................. 714/718; 326/16; 365/201
See application file for complete search history.

(56) References Cited

U.S. PATENT DOCUMENTS

| 7,107,500 | B2 * | 9/2006 | Jang ....................... G11C 29/46 365/201 |
| 8,122,306 | B2 * | 2/2012 | Seo ................... G01R 31/31701 702/117 |
| 8,238,179 | B2 * | 8/2012 | Yun ........................ G11C 29/46 365/191 |
| 2004/0252564 | A1 * | 12/2004 | Do ......................... G11C 29/46 365/201 |
| 2008/0048671 | A1 * | 2/2008 | Ha .................... G01R 31/31721 324/550 |
| 2009/0070061 | A1 * | 3/2009 | Cha ........................ G11C 29/46 702/120 |
| 2010/0032669 | A1 * | 2/2010 | An ......................... G11C 29/46 257/48 |
| 2010/0074031 | A1 * | 3/2010 | Kim ....................... G11C 29/46 365/189.05 |
| 2011/0025364 | A1 * | 2/2011 | Yun .................. G01R 31/31701 324/762.01 |
| 2012/0008441 | A1 * | 1/2012 | Kim ....................... G11C 29/24 365/200 |

FOREIGN PATENT DOCUMENTS

| CN | 1371100 A | 9/2002 |
| CN | 1783347 A | 6/2006 |

(Continued)

*Primary Examiner* — Jason M Crawford
(74) *Attorney, Agent, or Firm* — William Park & Associates Ltd.

(57) ABSTRACT

Various embodiments of a test mode control circuit of a semiconductor apparatus and related methods are disclosed. In one exemplary embodiment, the test mode control circuit may include: a test mode control block configured to generate a plurality of control signal sets in response to a first address signal set and a second address signal set which are sequentially inputted; a test mode transfer block configured to transfer a plurality of test mode signals, which are generated according to a combination of the plurality of control signal sets, to a plurality of circuit blocks of the semiconductor apparatus; and a plurality of global lines configured to transmit the plurality of control signal sets to the test mode transfer block.

20 Claims, 20 Drawing Sheets

(56) References Cited

FOREIGN PATENT DOCUMENTS

| | | |
|---|---|---|
| CN | 101677023 A | 3/2010 |
| CN | 101729056 A | 6/2010 |
| EP | 0364925 B1 | 9/1994 |
| JP | 2003021665 A | 1/2003 |
| KR | 10-1999-0073874 A | 10/1999 |
| KR | 1020030027317 A | 4/2003 |
| KR | 1020060072527 A | 6/2006 |
| KR | 100931024 B1 | 12/2009 |

* cited by examiner

FIG.13
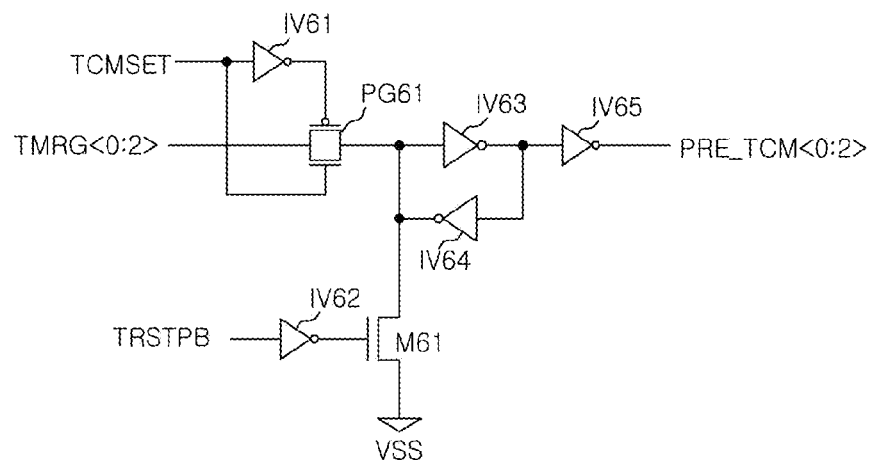
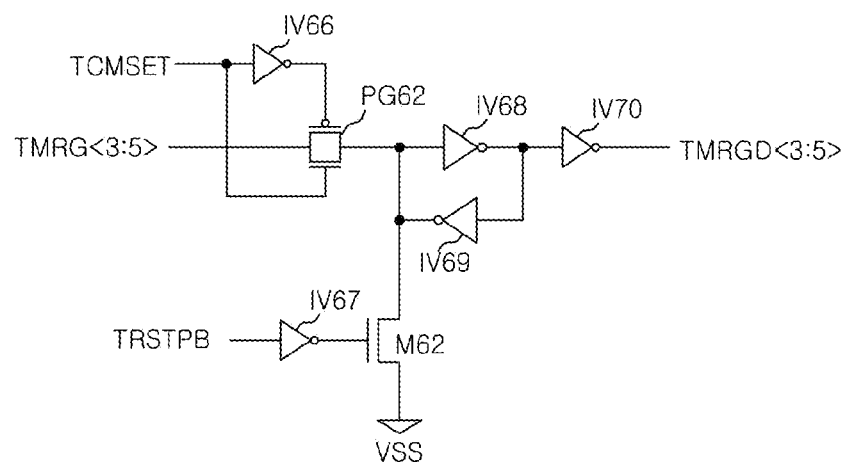

FIG.18
222
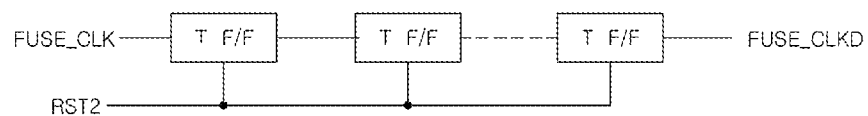
FIG.19
223
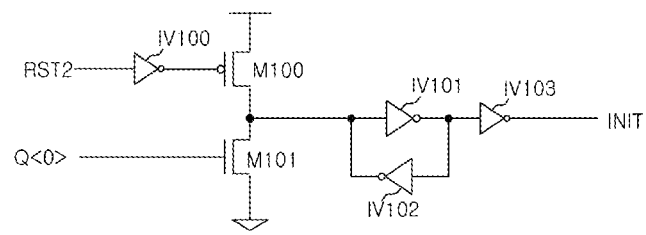
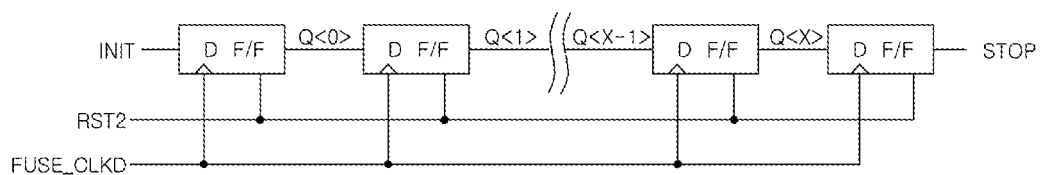

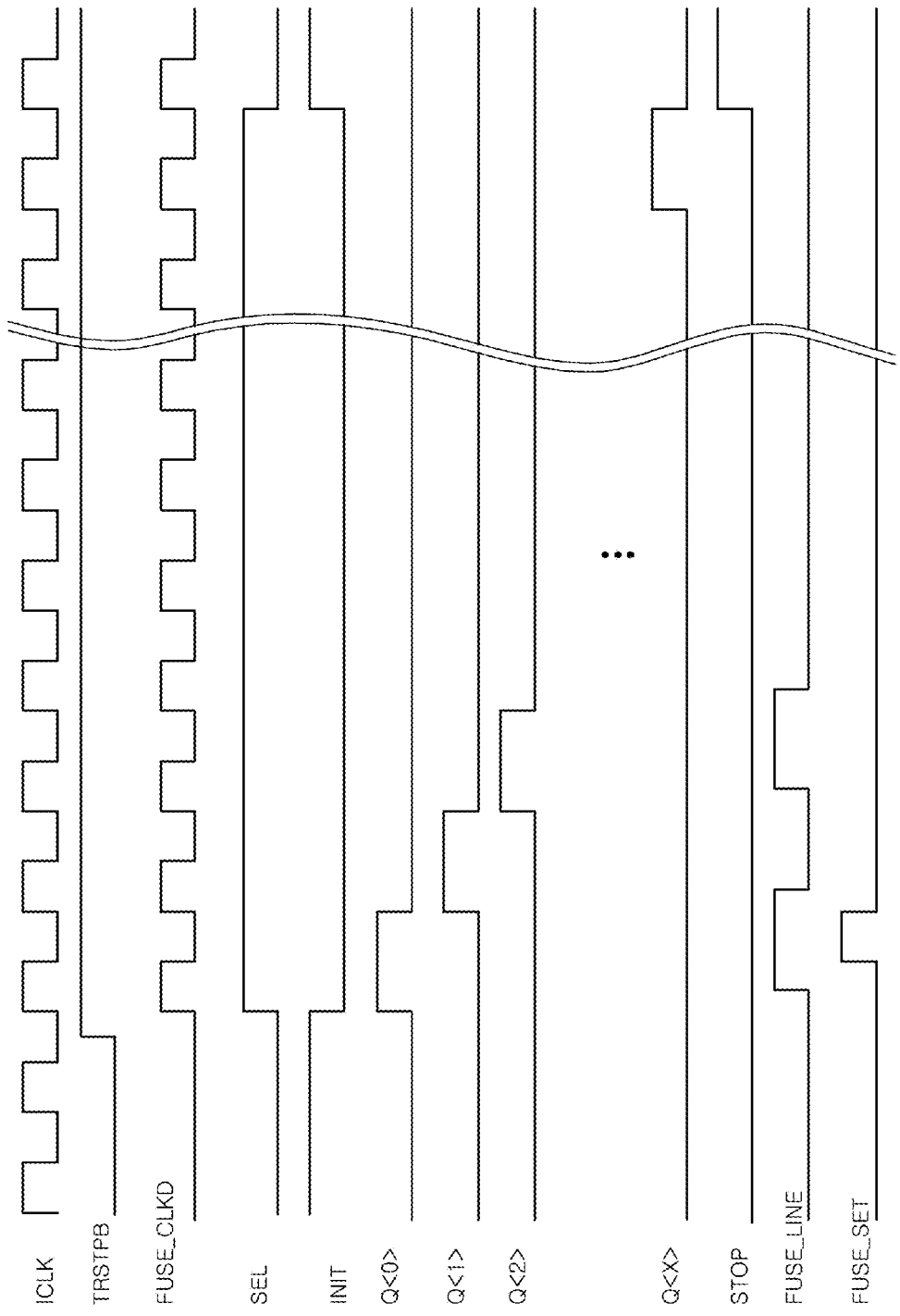

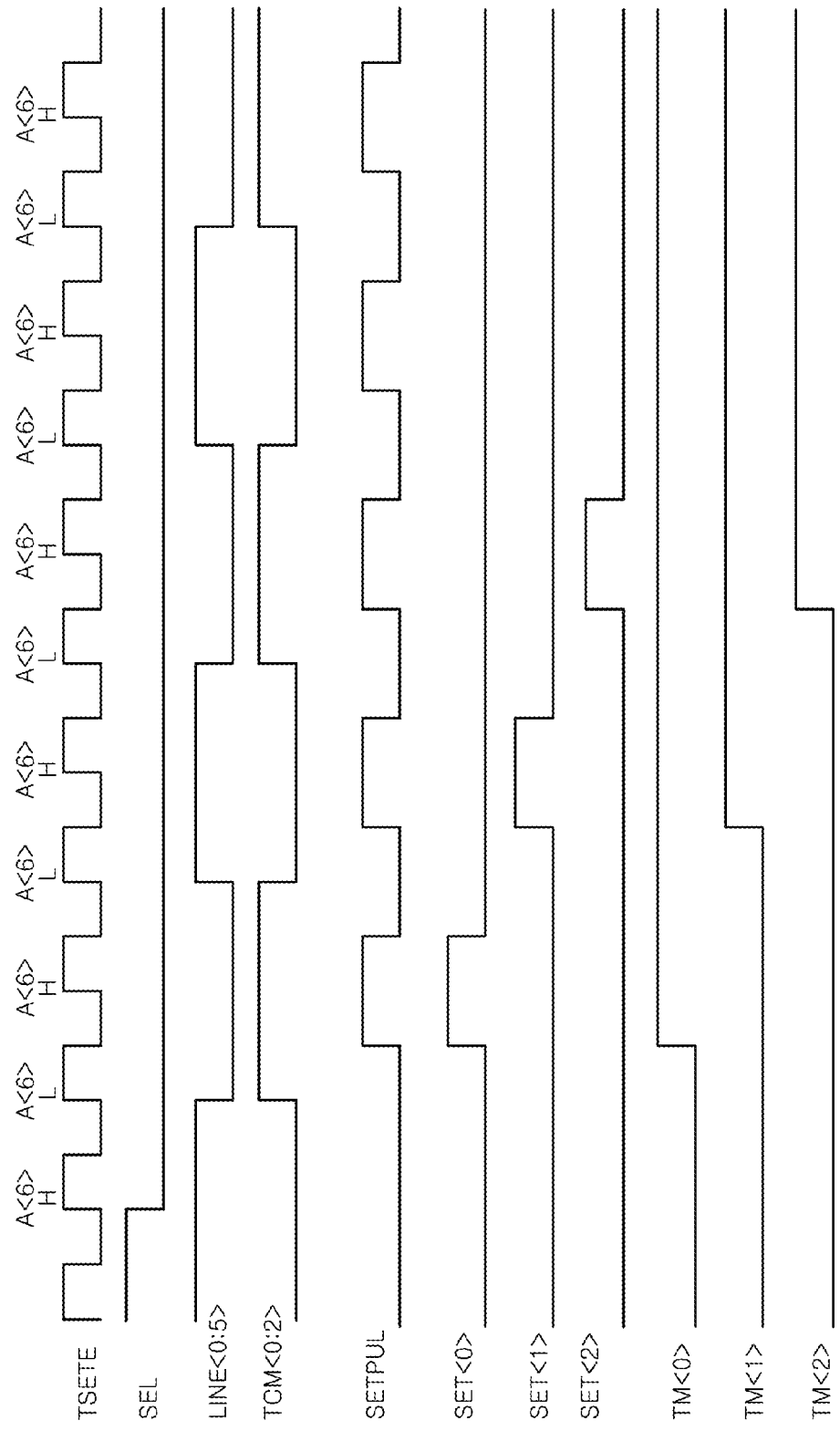

TEST MODE CONTROL CIRCUIT OF SEMICONDUCTOR APPARATUS AND CONTROL METHOD THEREOF

CROSS-REFERENCE TO RELATED APPLICATION

The present application claims priority under 35 U.S.C. §119(a) to Korean Patent Application No. 10-2010-0114405, filed on Nov. 17, 2010, in the Korean Intellectual Property Office, which is incorporated herein by reference in its entirety as if set forth in full.

BACKGROUND

1. Technical Field

Various embodiments of the present disclosure generally relate to a semiconductor apparatus and related methods. In particular, certain embodiments relate to a test mode control circuit of a semiconductor apparatus and a control method thereof.

2. Related Art

In a semiconductor apparatus, circuit blocks which are used inside the semiconductor apparatus are tested using test modes, and corresponding test results are stored, so that the circuit blocks are operated in conformity with the stored test results in a normal mode.

Referring to FIG. 1, a conventional test mode control circuit 1 of a semiconductor apparatus may include a test mode control block 10, a plurality of fuse sets 20, and global lines 40.

The test mode control block 10 is configured to generate test mode signals according to external commands and address signals.

In the conventional art, when generating the test mode signals, address signals of 7 bits may be used. That is, a maximum of 128 test mode signals may be generated.

The plurality of fuse sets 20 are connected in one-to-one correspondence with circuit blocks (e.g., use logics ULs) 30 which operate inside the semiconductor apparatus.

The plurality of fuse sets 20 are used to store information as to whether or not to use test modes. For example, the plurality of fuse sets 20 may be configured to store test mode signals and transfer, in a normal operation mode, the stored test mode signals to the circuit blocks (ULs) 30 which are connected with the fuse sets 20.

Since the fuse sets 20 and the circuit blocks (ULs) 30 correspond one-to-one with each other, the global lines 40 for transferring the test mode signals generated by the test mode control block 10 should be provided as many as the number of the test mode signals.

The plurality of circuit blocks 30 shown in FIG. 1 may be included in memory banks BANK A through BANK H shown in FIG. 2.

The global lines 40 are disposed entirely over a peripheral region PERI, and the fuse sets 20 are evenly disposed over the peripheral region PERI adjacent to the memory banks BANK A through BANK H.

The conventional art described above may have the following problems.

First, since the test mode signals are generated by the combinations of the 7-bit address signals, the number of test modes to be generated is limited to 128 at the maximum.

Second, since the fuse sets 20 and the circuit blocks (ULs) 30 correspond one-to-one with each other, a large number of fuse sets are needed. Further, since as many global lines 40 as the number of the test mode signals are needed, a circuit area may be increased.

SUMMARY

Accordingly, there is a need for an improved test mode control circuit that may obviate one or more problems mentioned above. In particular, various aspects of the present disclosure may provide a test mode control circuit of a semiconductor apparatus, and related control methods, which can allow the number of test modes to be readily increased and/or a circuit area to be reduced.

To attain the advantages and in accordance with the purposes of the invention, as embodied and broadly described herein, one exemplary aspect of the present disclosure may provide a test mode control circuit of a semiconductor apparatus. The apparatus may comprise: a test mode control block configured to generate a plurality of control signal sets in response to a first address signal set and a second address signal set which are sequentially inputted; a test mode transfer block configured to transfer a plurality of test mode signals, which are generated according to a combination of the plurality of control signal sets, to a circuit block of the semiconductor apparatus; and a plurality of global lines configured to transmit the plurality of control signal sets to the test mode transfer block.

In another exemplary aspect, a test mode control circuit of a semiconductor apparatus may comprise: a test mode control block configured to generate a plurality of preliminary control signal sets in response to a first address signal set and a second address signal set which are sequentially inputted, and output one set of the plurality of preliminary control signal sets and a plurality of fuse signal sets, as a plurality of control signal sets, in response to a test reset signal; a test mode transfer block configured to transfer a plurality of test mode signals, which are generated according to a combination of the plurality of control signal sets, to one of a plurality of circuit blocks of the semiconductor apparatus; and a fuse set array configured to output the plurality of fuse signal sets in response to count signals.

According to some exemplary aspects of the present disclosure, a test mode control circuit of a semiconductor apparatus may comprise: a test mode control block configured to generate test mode encoding signals in response to address signals; a plurality of global lines and a decoding logic configured to decode the test mode encoding signals and generate decoding signals; and a test mode transfer block configured to transfer test mode signals to one circuit block corresponding to the decoding signals among a plurality of circuit blocks of the semiconductor apparatus.

Various exemplary aspects of the present disclosure may also provide a method for controlling a test mode of a semiconductor apparatus, where the semiconductor apparatus includes a plurality of latch arrays each of which includes a plurality of latches connected with a plurality of circuit blocks. The method may comprise: receiving sequentially a first address signal set and a second address signal set, each of the first and second address signal sets comprising test modes encoded therein; selecting one of the plurality of latch arrays by decoding the first address signal set; and transferring test mode signals to one of the plurality of circuit blocks through one latch of the selected latch array by decoding the second address signal set.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

FIG. 13 is a circuit diagram of the third latch section shown in FIG. 8.

FIG. 18 is a circuit diagram of the dividing section shown in FIG. 16.

FIG. 19 is a circuit diagram of the counting section shown in FIG. 16.

FIGS. 23 and 24 are timing diagrams illustrating exemplary operations of the test mode control circuit in accordance with an exemplary embodiment consistent with the present disclosure.

DETAILED DESCRIPTION

Figure 1:
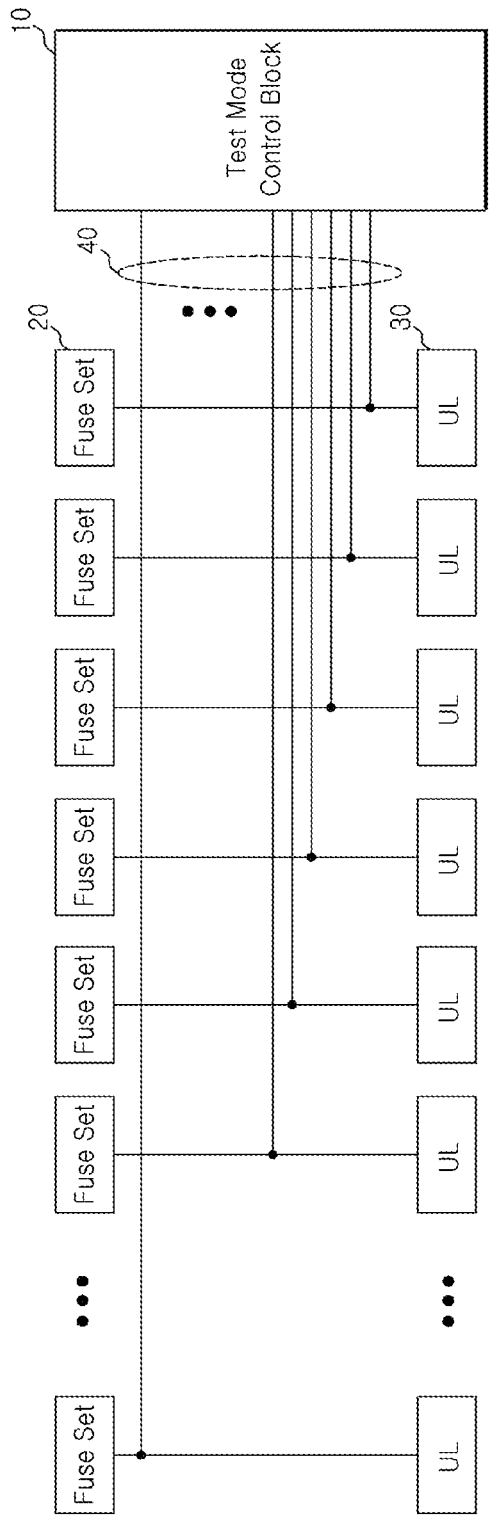
FIG. 1 is a block diagram illustrating a conventional test mode control circuit of a semiconductor apparatus.

Hereinafter, reference will now be made in detail to the exemplary embodiments of a test mode control circuit of a semiconductor apparatus and a control method thereof consistent with the present disclosure, examples of which will be described below with reference to the accompanying drawings. Wherever possible, the same reference characters will be used throughout the drawings to refer to the same or like parts.

In various exemplary embodiments, respective test mode signals are not directly transferred to circuit blocks operating inside a semiconductor apparatus. Instead, test mode encoding signals, which are generated by encoding test modes, are transferred through global lines, and an element (such as, for example, a decoding logic and a latch array) that receives the encoding signals from the global lines decodes the received signals and transfers the test mode signals to circuit blocks operating inside a semiconductor apparatus.

As will be described later, the test mode encoding signals may include first control signals LINE<0:5>, second control signals SET<0:7>, and third control signals TCM<0:2>.

In an address signal, the logic level in a specific bit is set differently, and test modes are encoded in the remaining bits. By inputting the address signals with time differences, the number of test modes can be significantly increased, even when the address signals of the conventional art are used.

Figure 3:
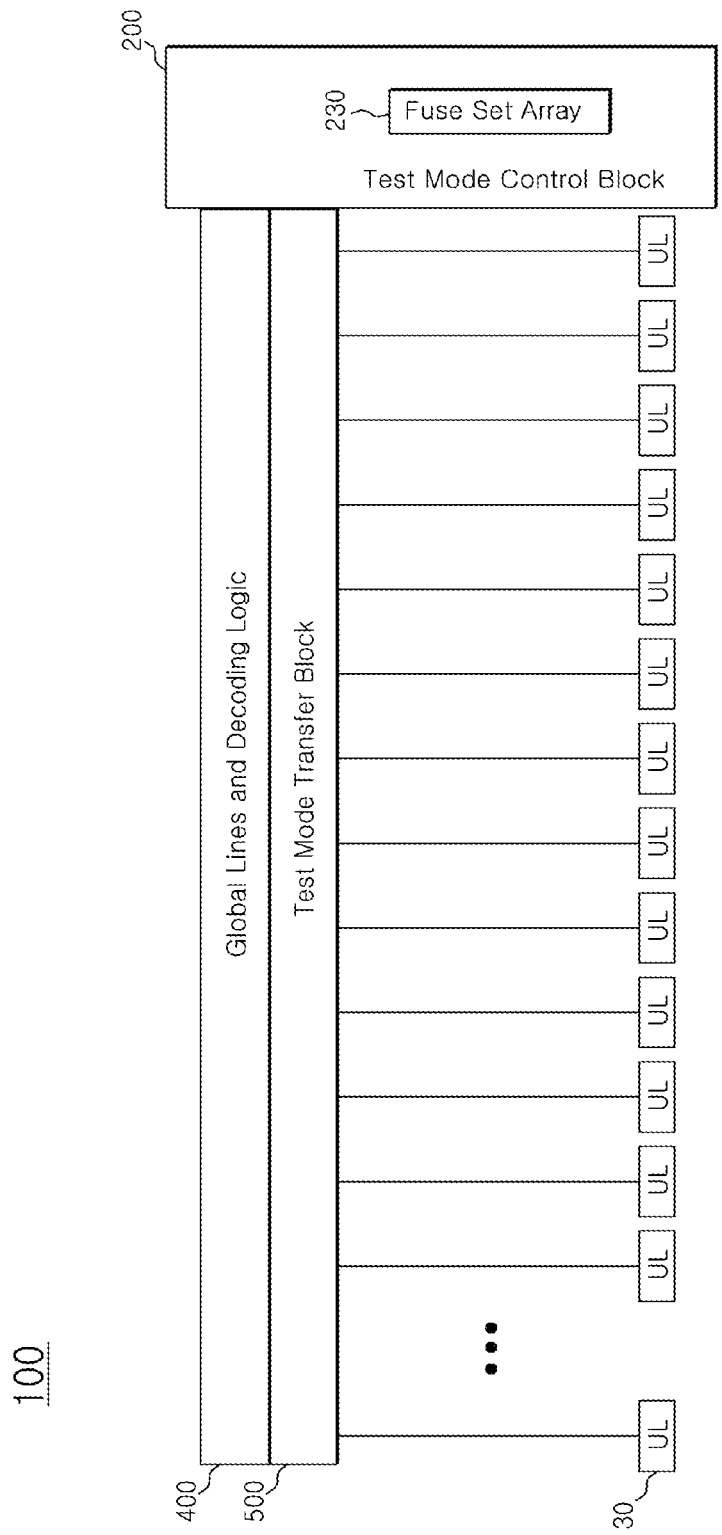
FIG. 3 is a block diagram illustrating a test mode control circuit of a semiconductor apparatus in accordance with an exemplary embodiment consistent with the present disclosure.

Referring to FIG. 3, a test mode control circuit 100 in accordance with an exemplary embodiment consistent with the present disclosure may include a test mode control block 200, global lines and decoding logic 400, and a test mode transfer block 500.

The test mode transfer block 500 and circuit blocks (e.g., use logics ULs) 30 are connected with each other such that test mode signals can be transferred to the circuit blocks 30 operating inside the semiconductor apparatus.

Figure 2:
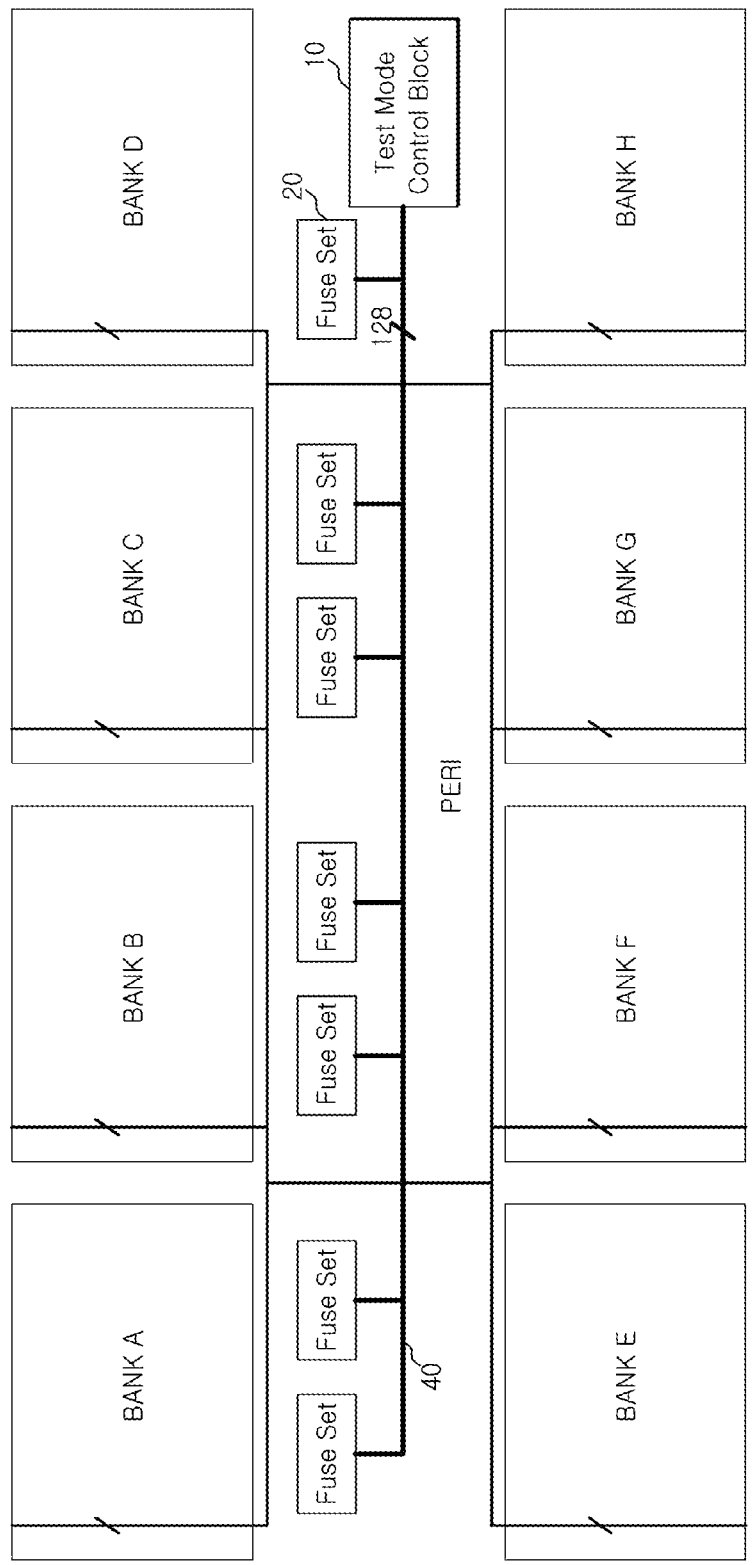
FIG. 2 is a diagram illustrating the layout of the global lines and the fuse sets shown in FIG. 1.

The test mode control block 200 may include a fuse set array 230. Different from the conventional semiconductor apparatus shown in FIGS. 1 and 2, where the plurality of fuse sets 20 are evenly disposed over the peripheral region PERI, the present disclosed embodiment includes the fuse set array 230 concentratedly disposed in a specified region.

The layout of the fuse set array 230 may have a variety of different designs. For example, while the fuse set array 230 is depicted as being disposed in the test mode control block 200, it is conceivable that the fuse set array 230 may be disposed in a separate region, such as a region adjacent to the test mode control block 200.

Figure 4:
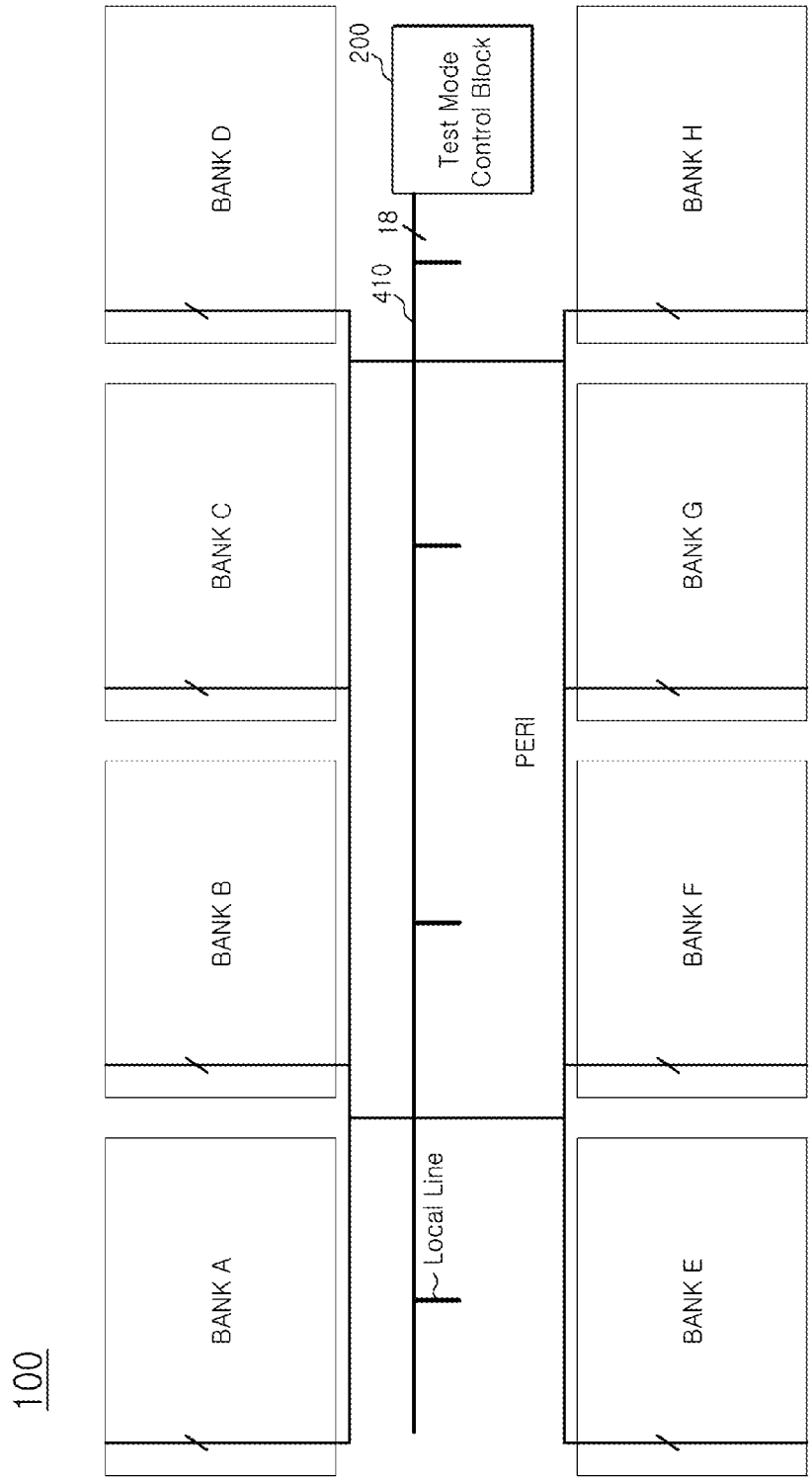
FIG. 4 is a diagram illustrating the layout of global lines in the test mode control circuit shown in FIG. 3.

Memory banks BANK A through BANK H shown in FIG. 4 may include the plurality of circuit blocks 30 shown in FIG. 3.

When compared to the conventional art, a decreased number of global lines 410 may be disposed in a peripheral region PERI. The global lines 410 extend to regions adjacent to the memory banks BANK A through BANK H that require test mode signals.

The test mode transfer block 500 shown in FIG. 3 may be connected with the memory banks BANK A through BANK H (e.g., the circuit blocks 30 of the memory banks BANK A through BANK H) via local lines.

As mentioned above, the fuse set array 230 may not be disposed in the peripheral region PERI.

Figure 5:
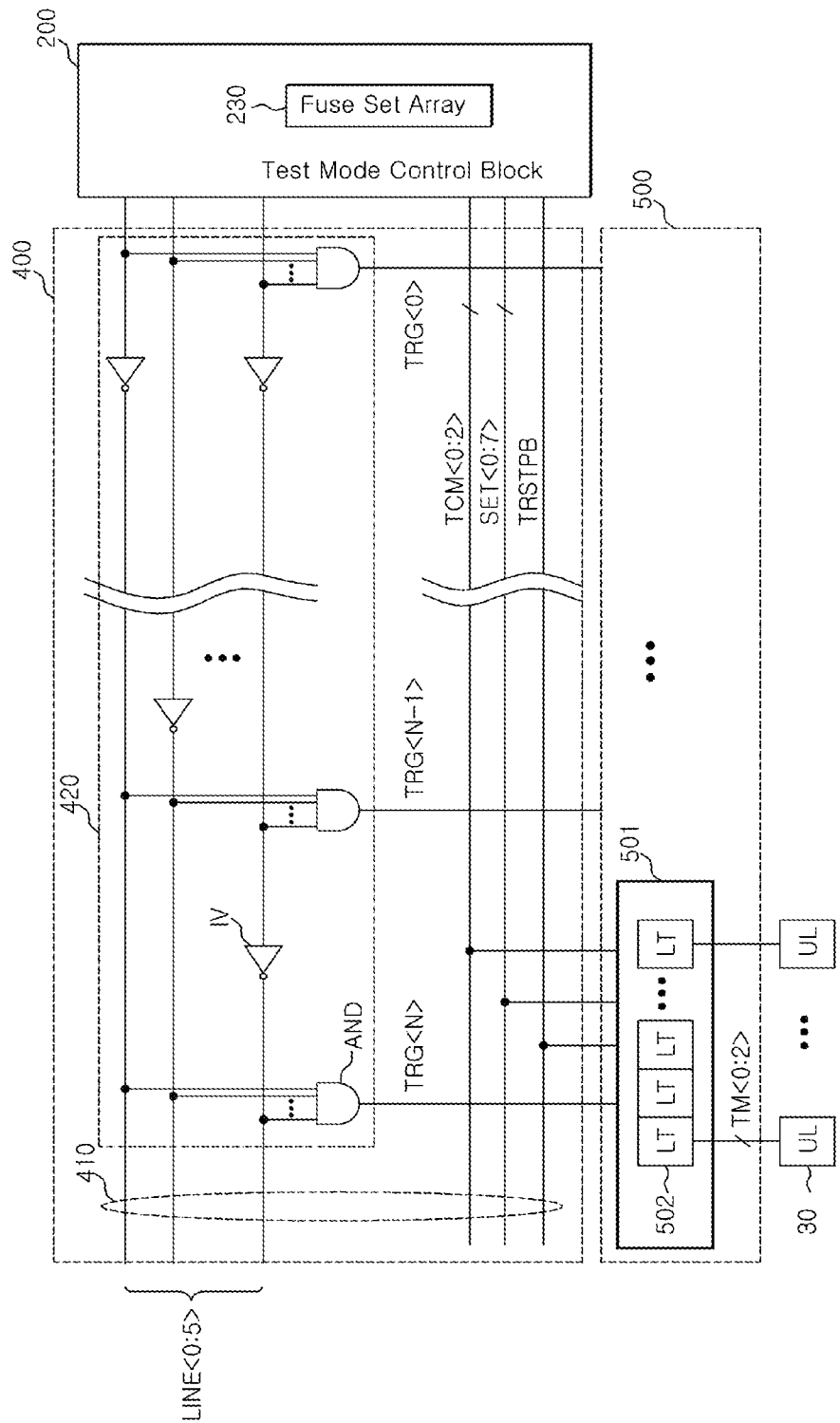
FIG. 5 is a circuit diagram illustrating the detailed configurations of the global lines, decoding logic, and the test mode transfer block shown in FIG. 3.

Referring to FIG. 5, through the global lines 410, first control signals LINE<0:5> are transferred to a decoding logic 420, and second control signals SET<0:7>, third control signals TCM<0:2>, and a test reset signal TRSTPB are transferred to the test mode transfer block 500.

The decoding logic 420 may be configured to generate decoding signals TRG<0:N> in response to the first control signals LINE<0:5>.

The decoding logic 420 may include a plurality of inverters IV and a plurality of AND gates AND.

The plurality of inverters IV are connected to global lines 410 for transferring the first control signals LINE<0:5>, among the global lines 410.

The decoding logic 420 is configured such that only one of the decoding signals TRG<0:N>, which are outputted from the plurality of AND gates AND, has a high logic level of '1' in response to the first control signals LINE<0:5>.

The test mode transfer block 500 may be configured to output the third control signals TCM<0:2> as test mode signals TM<0:2> in response to the first control signals LINE<0:5> and the second control signals SET<0:7>.

The test mode transfer block 500 may include a plurality of latch arrays 501. Each latch array 501 may include a plurality of latches 502. The latch arrays 501 may be provided as many as the number of the AND gates AND.

The plurality of latches 502 are connected with the respective circuit blocks 30.

As one of the decoding signals TRG<0:N> is selected to have a high logic level in response to the first control signals LINE<0:5>, any one of the plurality of latch arrays 501 is selected.

One of the plurality of latches 502 of the latch array 501 can be selected in response to the second control signals SET<0:7>.

The selected latch 502 outputs the test mode signals TM<0:2> to the circuit block 30 connected therewith, in response to the third control signals TCM<0:2>.

Figure 6:
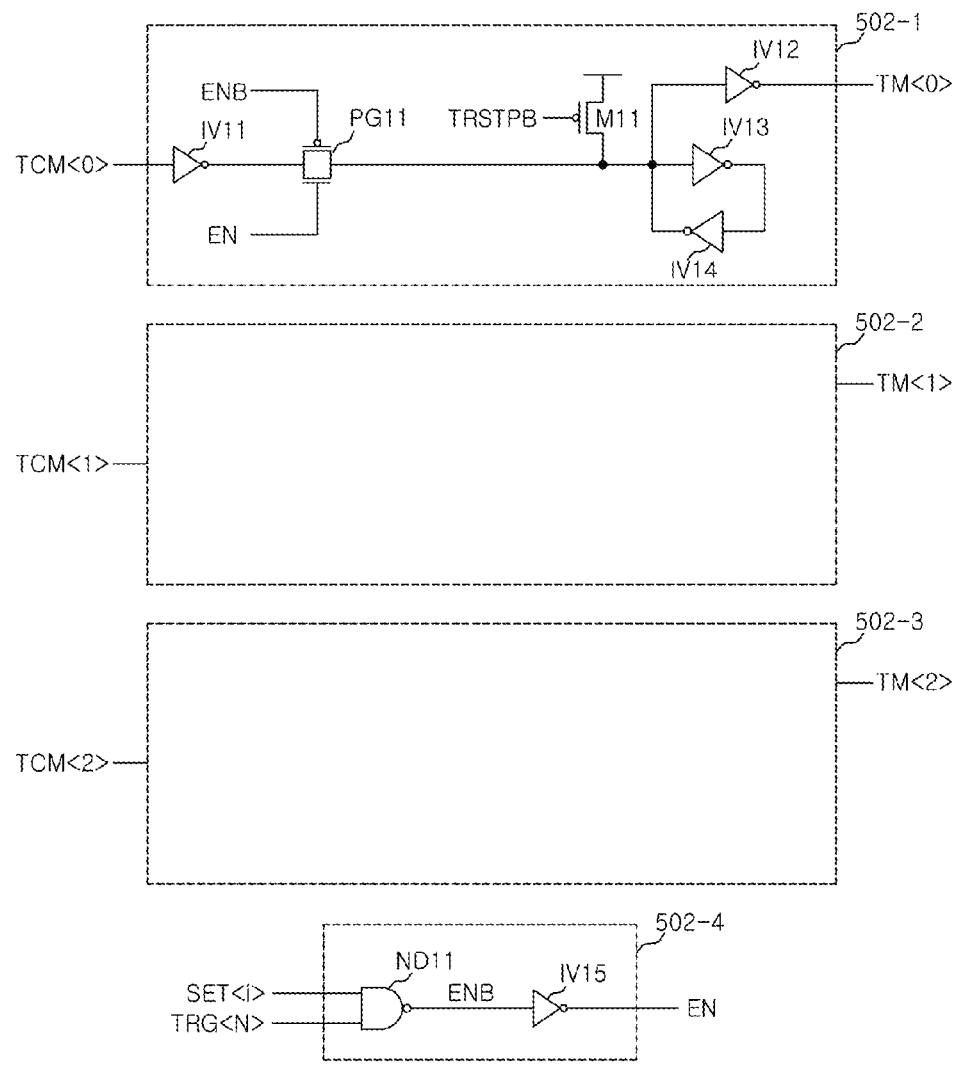
FIG. 6 is a circuit diagram of the latch shown in FIG. 5.

Referring to FIG. 6, the latch 502 may include a plurality of latch stages 502-1 through 502-3 and an activation signal generation stage 502-4.

The plurality of latch stages 502-1 though 502-3 are configured to latch the third control signals TCM<0:2> in response to activation signals EN and ENB and output the latched signals as the test mode signals TM<0:2>.

The plurality of latch stages 502-1 through 502-3 initialize the test mode signals TM<0:2> to low logic levels of '0' in response to the test reset signal TRSTPB.

The latch stage 502-1 may include a plurality of inverters IV11 through IV14, a pass gate PG11, and a transistor M11. The remaining latch stages 502-2 and 502-3 may be configured in the same way as the latch stage 502-1.

The activation signal generation stage 502-4 may be configured to generate the activation signals EN and ENB in response to the second control signal SET<i> (where i is any one of 0 to 7) and the decoding signal TRG<N>.

The activation signal generation stage 502-4 may include a NAND gate ND11 and an inverter IV15.

Figure 7:
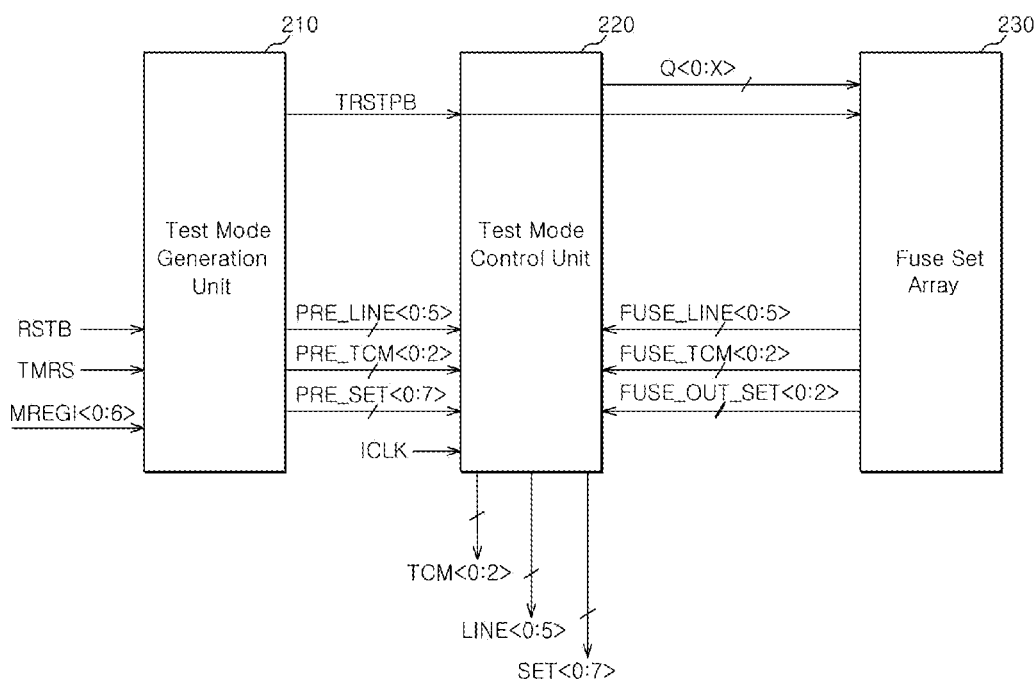
FIG. 7 is a block diagram illustrating the internal configuration of the test mode control block shown in FIG. 3.

Referring to FIG. 7, the test mode control block 200 may include a test mode generation unit 210, a test mode control unit 220, and the fuse set array 230.

The test mode generation unit 210 may be configured to generate the test reset signal TRSTPB, first preliminary control signals PRE_LINE<0:5>, second preliminary control signals PRE_SET<0:7>, and third preliminary control signals PRE_TCM<0:2> in response to a reset signal RSTB, a mode register signal TMRS, and address signals MREGI<0:6>.

The mode register signal TMRS is a signal that defines a test mode among MRS signals.

The test mode control unit 220 may be configured to generate count signals Q<0:X> in response to the test reset signal TRSTPB and a clock signal ICLK and output either the set of the first through third preliminary control signals PRE_LINE<0:5>, PRE_SET<0:7>, and PRE_TCM<0:2> or the set of first through third fuse signals FUSE_LINE<0:5>, FUSE_SET<0:7>, and FUSE_TCM<0:2>, as the first through third control signals LINE<0:5>, SET<0:7>, and TCM<0:2>.

The second fuse signals FUSE_SET<0:7> are generated by the test mode control unit 220 internally using the preliminary fuse signals FUSE_OUT_SET<0:2> as will be described in more detail with reference to FIG. 16.

The fuse set array 230 may be configured to output the first and third fuse signals FUSE_LINE<0:5> and FUSE_TCM<0:2> and preliminary fuse signals FUSE_OUT_SET<0:2> in response to the test reset signal TRSTPB and the count signals Q<0:X>.

Figure 8:
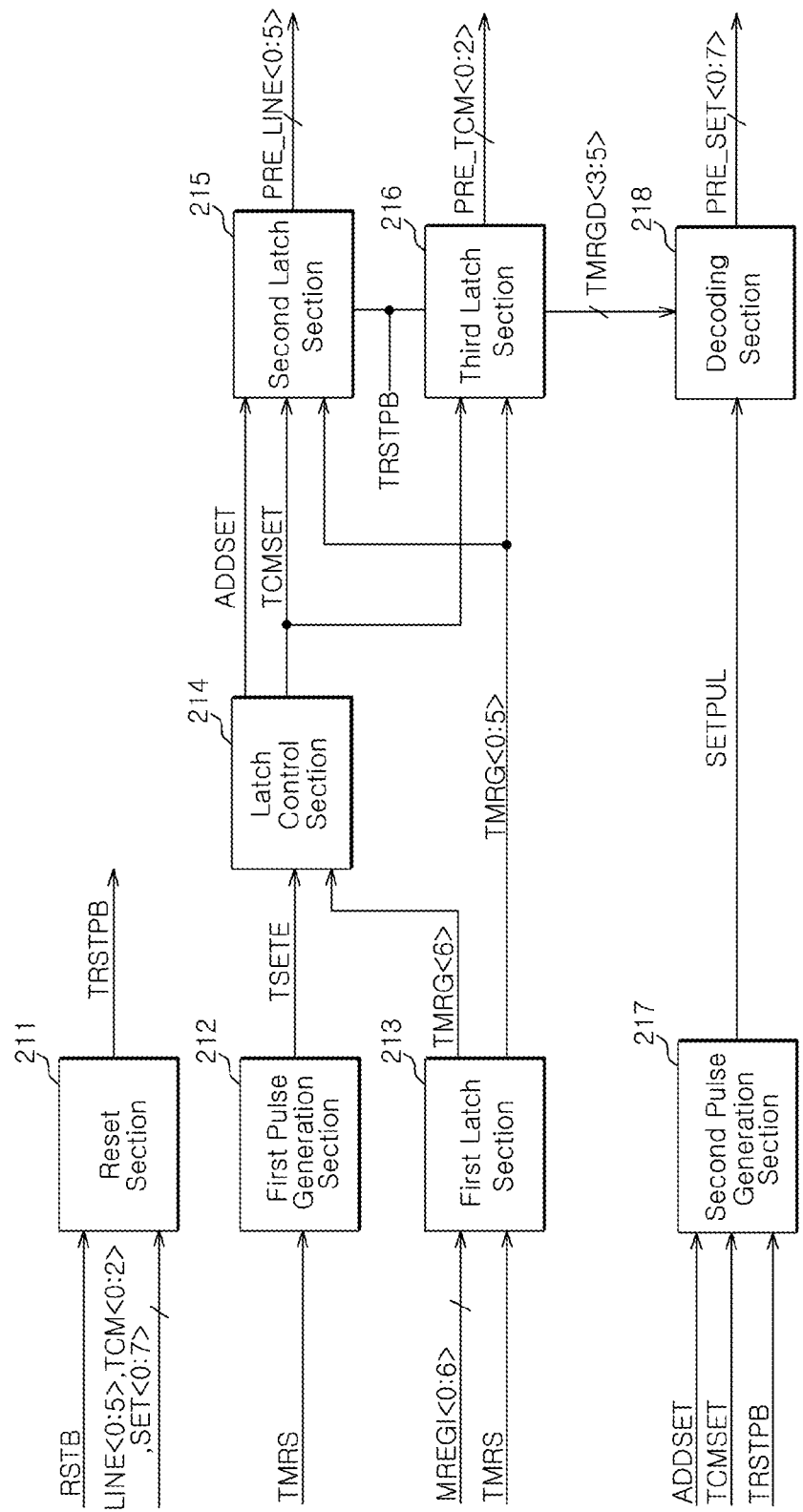
FIG. 8 is a block diagram illustrating the internal configuration of the test mode generation unit shown in FIG. 7.

Referring to FIG. 8, the test mode generation unit 210 may include a reset section 211, a first pulse generation section 212, a first latch section 213, a latch control section 214, a second latch section 215, a third latch section 216, a second pulse generation section 217, and a decoding section 218.

The reset section 211 may be configured to generate the test reset signal TRSTPB in response to the reset signal RSTB, the first control signals LINE<0:5>, the second control signals SET<0:7> and the third control signals TCM<0:2>.

The first pulse generation section 212 may be configured to generate a first pulse signal TSETE in response to the mode register signal TMRS.

The first latch section 213 may be configured to generate test address signals TMRG<0:6> in response to the address signals MREGI<0:6> and the mode register signal TMRS.

The latch control section 214 may be configured to generate latch control signals ADDSET and TCMSET in response to the first pulse signal TSETE and the test address signal TMRG<6>.

The second latch section 215 may be configured to generate the first preliminary control signals PRE_LINE<0:5> in response to the latch control signals ADDSET and TCMSET, the test address signals TMRG<0:5>, and the test reset signal TRSTPB.

The third latch section 216 may be configured to generate the third preliminary control signals PRE_TCM<0:2> and delayed test address signals TMRGD<3:5> in response to the latch control signal TCMSET, the test address signals TMRG<0:5>, and the test reset signal TRSTPB.

The second pulse generation section 217 may be configured to generate a second pulse signal SETPUL in response to the latch control signals ADDSET and TCMSET and the test reset signal TRSTPB.

The decoding section 218 may be configured to decode the delayed test address signals TMRGD<3:5> in response to the second pulse signal SETPUL and generate the second preliminary control signals PRE_SET<0:7>.

Figure 9:
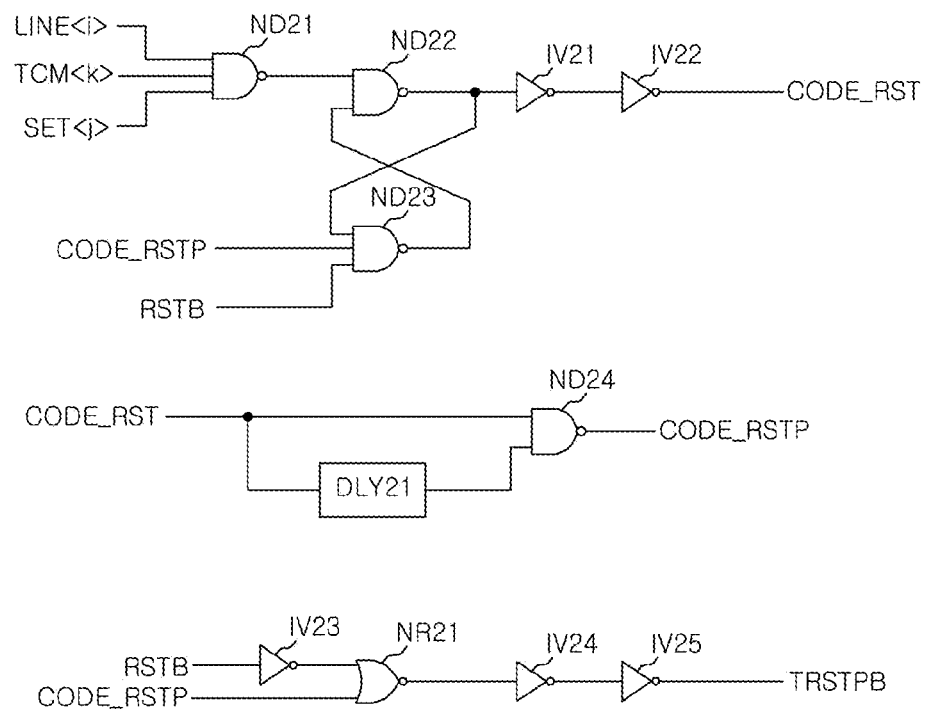
FIG. 9 is a circuit diagram of the reset section shown in FIG. 8.

Referring to FIG. 9, the reset section 211 may include a plurality of NAND gates ND21 through ND24, a plurality of inverters IV21 through IV25, a NOR gate NR21, and a delay element DLY21.

When a first control signal LINE<i>, a second control signal SET<j>, and a third control signal TCM<k> have high logic levels, the reset section 211 transits a reset signal CODE_RST to a high logic level and generates a reset pulse signal CODE_RSTP using the reset signal CODE_RST.

In various exemplary embodiments, any combination of test modes may be assigned as a test mode reset. For example, in the case where a certain combination of control signals LINE<i>, SET<j>, and TCM<k> of the first control signals LINE<0:5>, the second control signals SET<0:7>, and the third control signals TCM<0:2> have high logic levels, the reset signal CODE_RST is activated.

The reset section 211 activates the test reset signal TRSTPB to a low logic level when the reset signal RSTB is activated to a low logic level or the reset pulse signal CODE_RSTP is activated to a high logic level.

Figure 10:
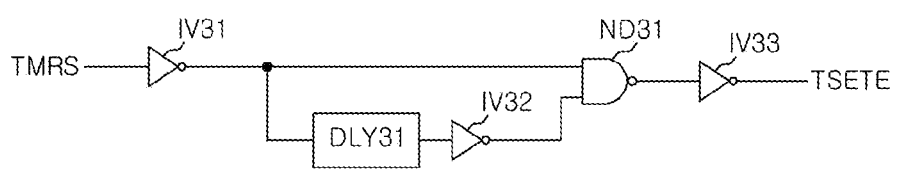
FIG. 10 is a circuit diagram of the first pulse generation section shown in FIG. 8.

Referring to FIG. 10, the first pulse generation section 212 may include a plurality of inverters IV31 through IV33, a NAND gate ND31, and a delay element DLY31. The first pulse generation section 212 generates the first pulse signal TSETE using the mode register signal TMRS.

Figure 11:
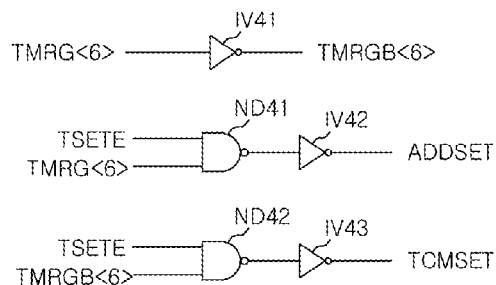
FIG. 11 is a circuit diagram of the latch control section shown in FIG. 8.

Referring to FIG. 11, the latch control section 214 may include a plurality of inverters IV41 through IV43 and a plurality of NAND gates ND41 and ND42.

The latch control section 214 inverts the test address signal TMRG<6> and generates a test address bar signal TMRGB<6>.

The latch control section 214 generates the latch control signal ADDSET by ANDing the test address signal TMRG<6> and the first pulse signal TSETE, and generates the latch control signal TCMSET by ANDing the test address bar signal TMRGB<6> and the first pulse signal TSETE.

Figure 12:
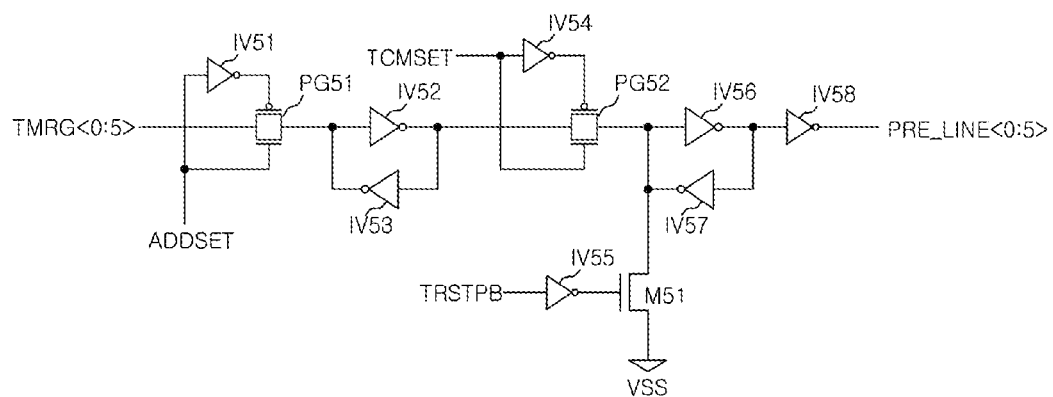
FIG. 12 is a circuit diagram of the second latch section shown in FIG. 8.

Referring to FIG. 12, the second latch section 215 may include a plurality of inverters IV51 through IV58, a plurality of pass gates PG51 and PG52, and a transistor M51.

The second latch section 215 latches the test address signals TMRG<0:5> in response to the latch control signal ADDSET and outputs the latched signals as the first preliminary control signals PRE_LINE<0:5> in response to the latch control signal TCMSET.

The second latch section 215 initializes the first preliminary control signals PRE_LINE<0:5> to low logic levels in response to the test reset signal TRSTPB.

Referring to FIG. 13, the third latch section 216 may include a plurality of inverters IV61 through IV70, a plurality of pass gates PG61 and PG62, and a plurality of transistors M61 and M62.

The third latch section 216 outputs the test address signals TMRG<0:2> as the third preliminary control signals PRE_TCM<0:2> in response to the latch control signal TCMSET.

The third latch section 216 outputs the test address signals TMRG<3:5> as the delayed test address signals TMRGD<3:5> in response to the latch control signal TCMSET.

The third latch section 216 initializes the third preliminary control signals PRE_TCM<0:2> and the delayed test address signals TMRGD<3:5> to low logic levels in response to the test reset signal TRSTPB.

Figure 14:
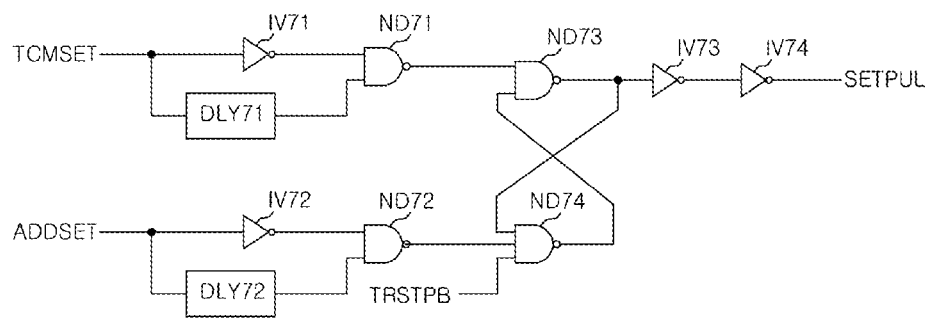
FIG. 14 is a circuit diagram of the second pulse generation section shown in FIG. 8.

Referring to FIG. 14, the second pulse generation section 217 may include a plurality of inverters IV71 through IV74, a plurality of NAND gates ND71 through ND74, and a plurality of delay elements DLY71 and DLY72. The second pulse generation section 217 generates the second pulse signal SETPUL, which is activated in response to the latch control signal ADDSET and is deactivated in response to the latch control signal TCMSET.

Figure 15:
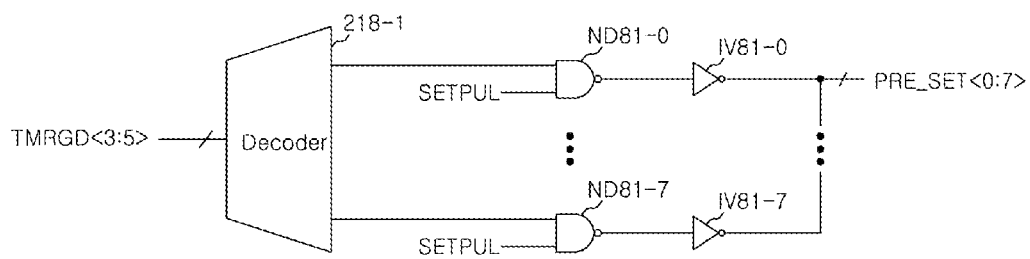
FIG. 15 is a circuit diagram of the decoding section shown in FIG. 8.

Referring to FIG. 15, the decoding section 218 may include a decoder 218-1, a plurality of inverters IV81-0 through IV81-7, and a plurality of NAND gates ND81-0 through ND81-7. The decoding section 218 decodes the delayed test address signals TMRGD<3:5>, ANDs the decoded signals with the second pulse signal SETPUL, and outputs the second preliminary control signals PRE_SET<0:7>.

Figure 16:
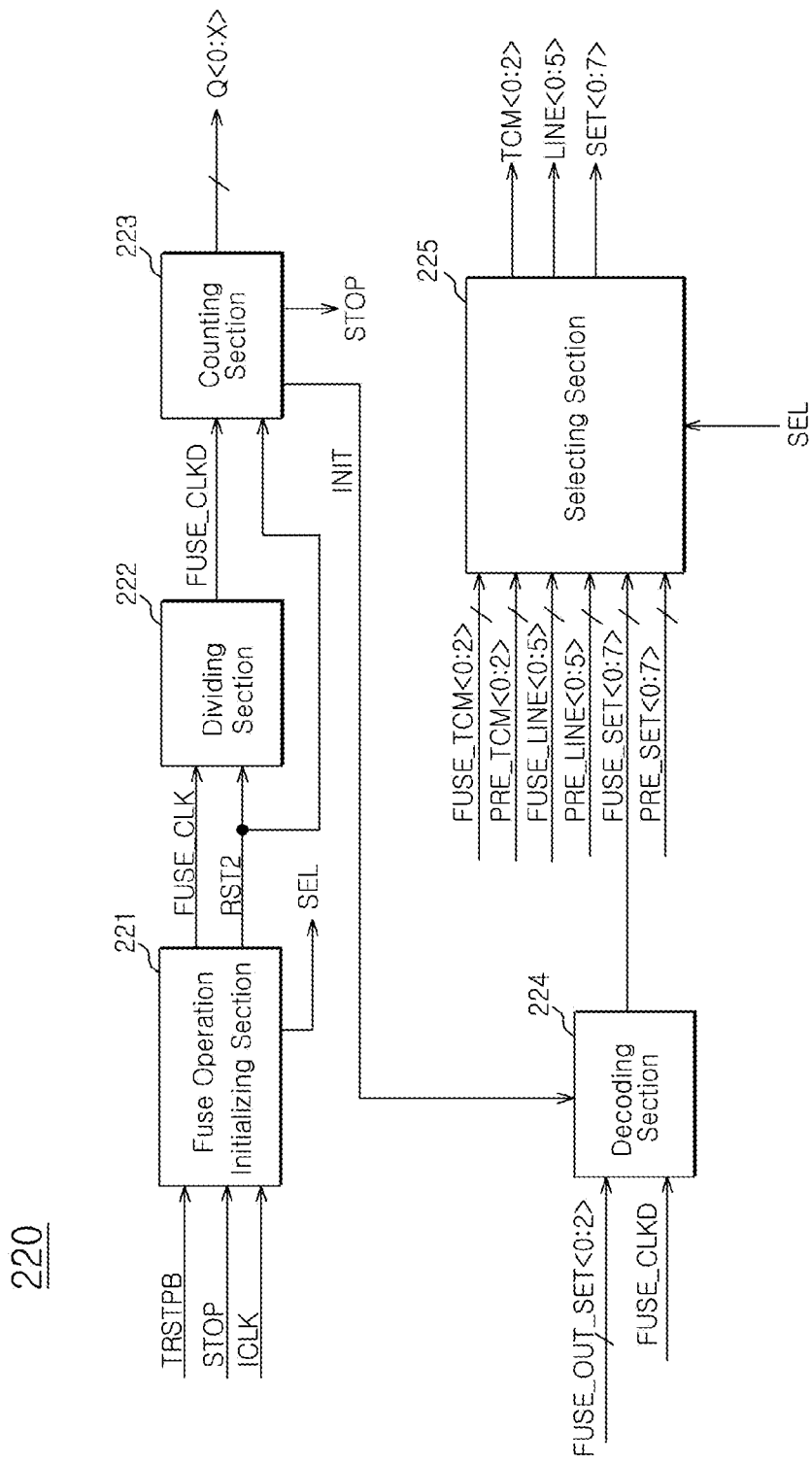
FIG. 16 is a block diagram illustrating the internal configuration of the test mode control unit shown in FIG. 7.

Referring to FIG. 16, the test mode control unit 220 may include a fuse operation initializing section 221, a dividing section 222, a counting section 223, a decoding section 224, and a selecting section 225.

The fuse operation initializing section 221 may be configured to generate a fuse clock signal FUSE_CLK, a select signal SEL and a reset signal RST2 in response to the test reset signal TRSTPB, a count stop signal STOP, and the clock signal ICLK.

The dividing section 222 may be configured to generate a divided fuse clock signal FUSE_CLKD in response to the fuse clock signal FUSE_CLK and the reset signal RST2.

The counting section 223 may be configured to generate the count signals Q<0:X>, a count start signal INIT, and the count stop signal STOP in response to the divided fuse clock signal FUSE_CLKD and the reset signal RST2.

The decoding section 224 may be configured to generate the second fuse signals FUSE_SET<0:7> in response to the divided fuse clock signal FUSE_CLKD, the count start signal INIT and preliminary fuse signals FUSE_OUT_SET<0:2>.

The selecting section 225 may be configured to output either the set of the first through third preliminary control signals PRE_LINE<0:5>, PRE_SET<0:7>, and PRE_TCM<0:2> or the set of the first through third fuse signals FUSE_LINE<0:5>, FUSE_SET<0:7>, and FUSE_TCM<0:2>, as the first through third control signals LINE<0:5>, SET<0:7>, and TCM<0:2>, in response to the select signal SEL.

Figure 17:
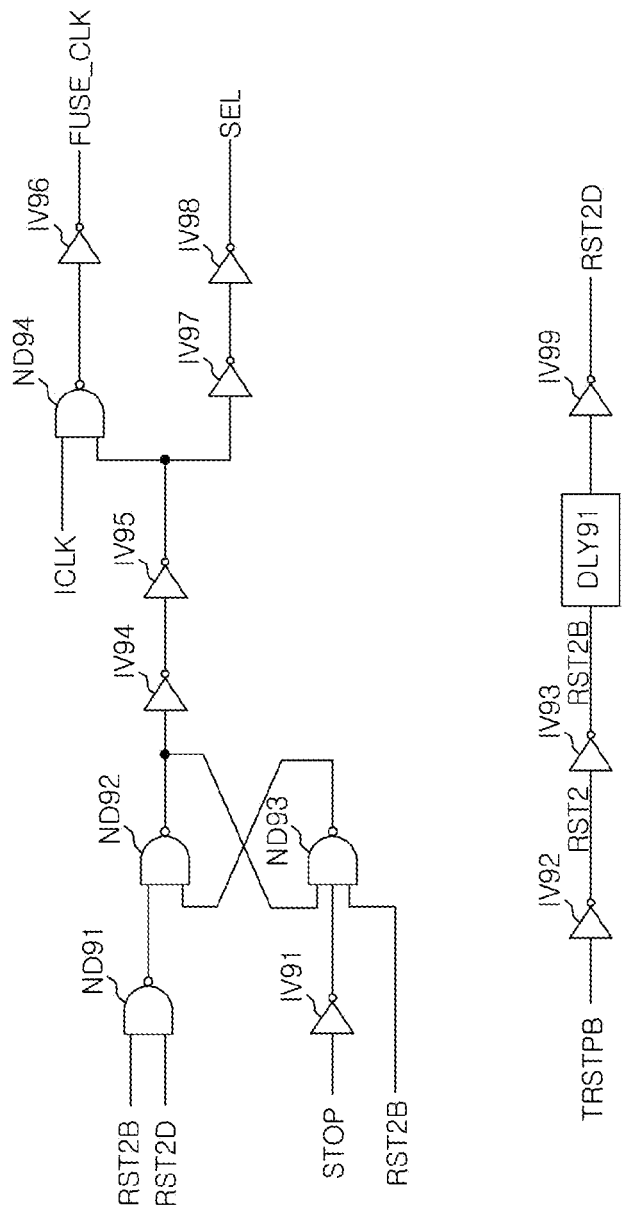
FIG. 17 is a circuit diagram of the fuse operation initializing section shown in FIG. 16.

Referring to FIG. 17, the fuse operation initializing section 221 may include a plurality of inverters IV91 through IV99, a plurality of NAND gates ND91 through ND94, and delay element DLY91.

The fuse operation initializing section 221 inverts and delays the test reset signal TRSTPB and generates reset signals RST2, RST2B, and RST2D.

As the test reset signal TRSTPB transits to a high logic level, the reset signal RST2B transits to a high logic level. At this time, the reset signal RST2D maintains a high logic level. Accordingly, the output of the NAND gate ND91 transits to a low logic level, and following this, the output of the NAND gate ND92 transits to a high logic level.

Therefore, the fuse operation initializing section 221 outputs the clock signal ICLK as the fuse clock signal FUSE_CLK from a time when the test reset signal TRSTPB transits to a high logic level to a time when the count stop signal STOP transits to a high logic level, and transits the select signal SEL to a high logic level.

Referring to FIG. 18, the dividing section 222 may include a plurality of flip-flops T F/F. The dividing section 222 divides the fuse clock signal FUSE_CLK to a preset division ratio and generates the divided fuse clock signal FUSE_CLKD. The dividing section 222 initializes the divided fuse clock signal FUSE_CLKD to a low logic level in response to the reset signal RST2.

Referring to FIG. 19, the counting section 223 may include a plurality of inverters IV100 through IV103, a plurality of transistors M100 and M101, and a plurality of flip-flops D F/F.

The counting section 223 sequentially generates the count signals Q<0:X> in response to the count start signal INIT which is activated according to the reset signal RST2.

The count start signal INIT may be deactivated in response to the activation of the count signal Q<0>.

The counting section 223 generates the count stop signal STOP in response to the count signal Q<X>.

Figure 20:
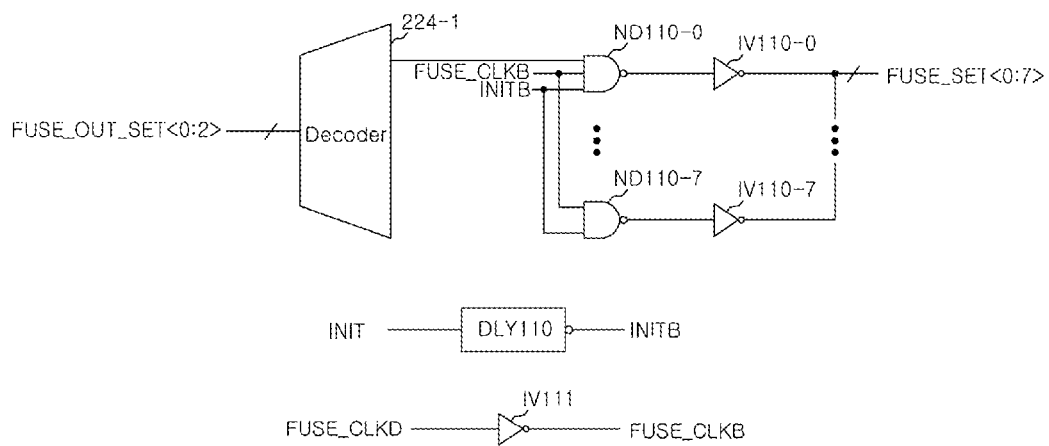
FIG. 20 is a circuit diagram of the decoding section shown in FIG. 16.

Referring to FIG. 20, the decoding section 224 may include a decoder 224-1, a plurality of inverters IV110-0 through IV110-7 and IV111, a plurality of NAND gates ND110-0 through ND110-7, and a delay element DLY110.

The decoding section 224 decodes the preliminary fuse signals FUSE_OUT_SET<0:2>, ANDs the decoded signals with a count start bar signal INITB and a bar signal FUSE_CLKDB, and outputs the second fuse signals FUSE_SET<0:7>. The bar signal FUSE_CLKDB is a signal obtained by inverting the divided fuse clock signal FUSE_CLKD.

Figure 21:
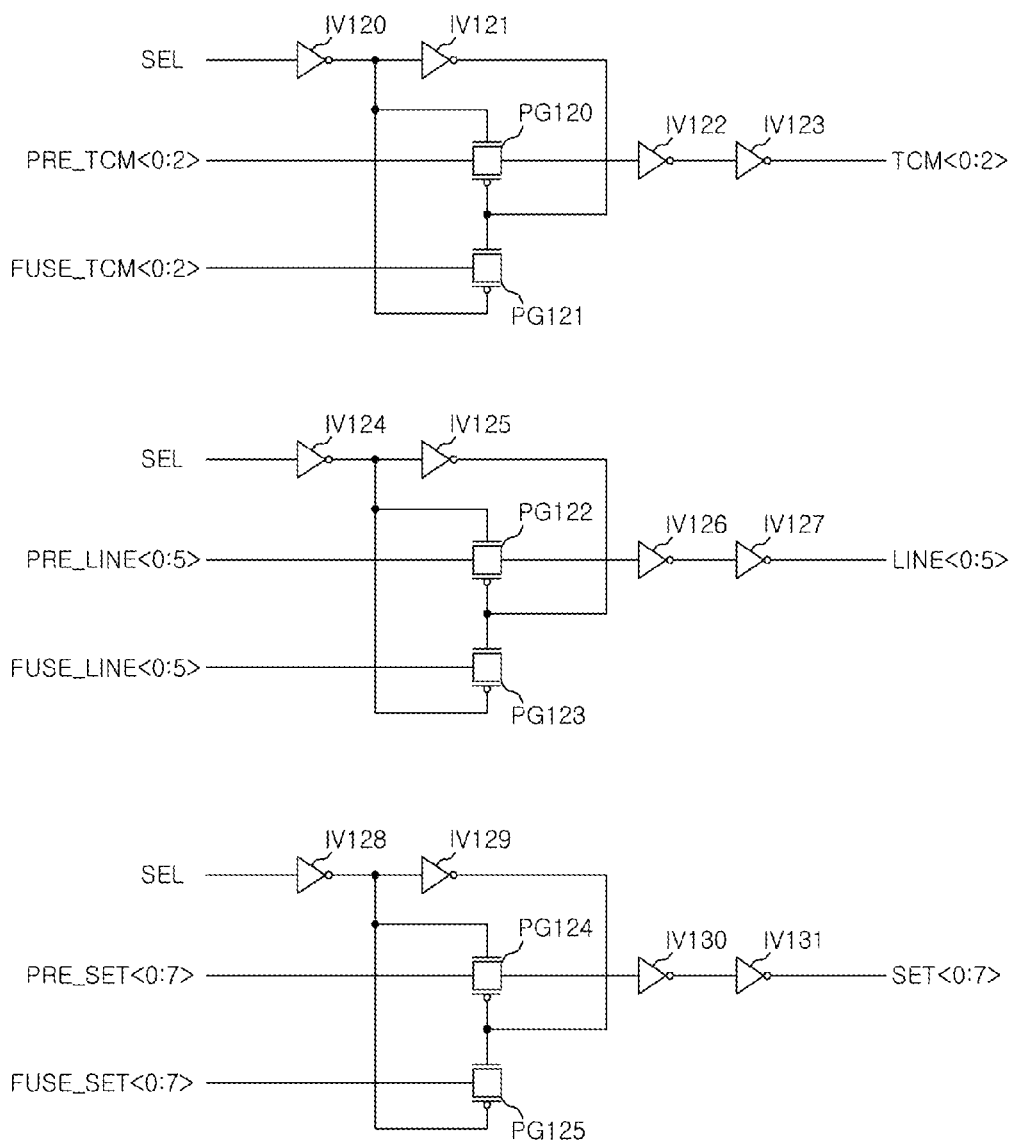
FIG. 21 is a circuit diagram of the selecting section shown in FIG. 16.

Referring to FIG. 21, the selecting section 225 may include a plurality of inverters IV120 through IV130 and a plurality of pass gates PG120 through PG125.

The selecting section 225 outputs the set of the first through third fuse signals FUSE_LINE<0:5>, FUSE_SET<0:7> and FUSE_TCM<0:2>, as the first through third control signals LINE<0:5>, SET<0:7> and TCM<0:2>, when the select signal SEL has a high logic level.

The selecting section 225 may be configured to output the set of the first through third preliminary control signals PRE_LINE<0:5>, PRE_SET<0:7>, and PRE_TCM<0:2>, as the first through third control signals LINE<0:5>, SET<0:7> and TCM<0:2>, when the select signal SEL has a low logic level.

Figure 22:
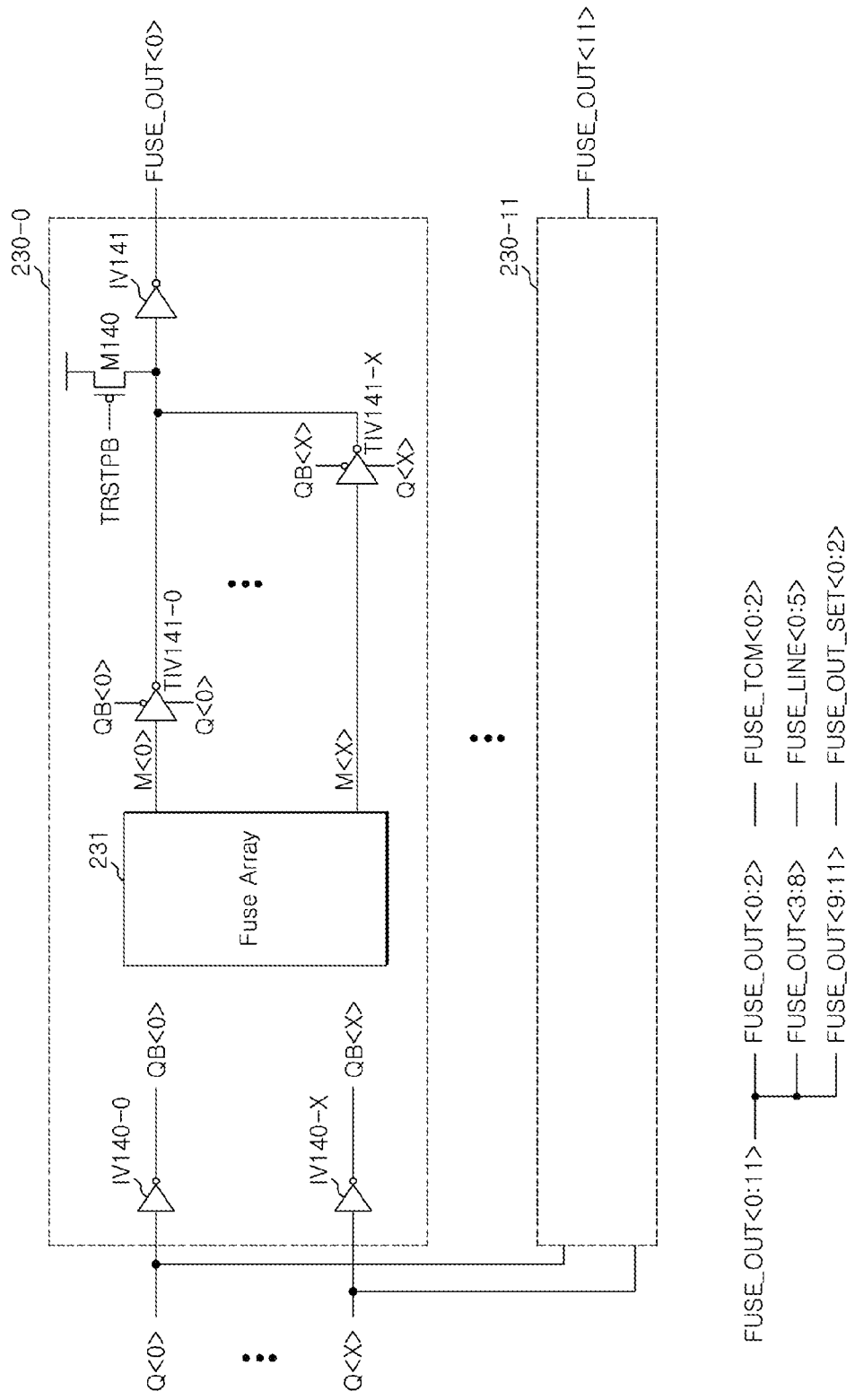
FIG. 22 is a circuit diagram illustrating the fuse set array shown in FIG. 7.

Referring to FIG. 22, the fuse set array 230 may include a plurality of fuse sets, for example, twelve fuse sets 230-0 through 230-11.

The fuse set 230-0 may include a plurality of inverters IV140-0 through IV140-X and IV141, a fuse array 231, a plurality of tri-state inverters IIV141-0 through TIV141-X, and a transistor M140. The fuse array 231 may include a plurality of fuses. The number of fuses may be X+1.

The remaining fuse sets 230-1 through 230-11 may be configured in the same way as the fuse set 230-0.

The plurality of fuse sets 230-0 through 230-11 may be configured to commonly receive the count signals Q<0:X>.

The fuse array 231 of each of the plurality of fuse sets 230-0 through 230-11 sequentially outputs fuse cutting information M<0:X> in response to the count signals Q<0:X> and count bar signals QB<0:X> which are sequentially activated.

Output signals FUSE_OUT<0:11> are generated according to 12-bit fuse cutting information M<0>, which is outputted from the plurality of fuse sets 230-0 through 230-11 in response to the count signal Q<0> and the count bar signal QB<0>.

In succession, output signals FUSE_OUT<0:11> are generated again according to 12-bit fuse cutting information M<1> which is outputted from the plurality of fuse sets 230-0 through 230-11 in response to the count signal Q<1> and the count bar signal QB<1>. In this way, the 12-bit output signals FUSE_OUT<0:11> are sequentially generated in response to the count signals Q<0:X>.

Among the output signals FUSE_OUT<0:11>, the signals FUSE_OUT<0:2>, FUSE_OUT<3:8> and FUSE_OUT<9:11> are outputted out of the fuse set array 230 as the third fuse signals FUSE_TCM<0:2>, the first fuse signals FUSE_LINE<0:5> and the preliminary fuse signals FUSE_OUT_SET<0:2>, respectively.

Hereinafter, the operations of the test mode control circuit in accordance with various exemplary embodiments of the present disclosure will be described.

Referring to FIG. 23, as the test reset signal TRSTPB transits to a high logic level (e.g., when a test mode is deactivated), the select signal SEL transits to a high logic level, and the count start signal INIT transits to a low logic level. Accordingly, the counting section 223 shown in FIG. 19 sequentially generates the count signals Q<0:X>.

The fuse set array 230 shown in FIG. 7 outputs the first fuse signals FUSE_LINE<0:5>, the third fuse signals FUSE_TCM<0:2>, and the preliminary fuse signals FUSE_OUT_SET<0:2> in response to the count signals Q<0:X>.

The decoding section 224 shown in FIG. 16 decodes the preliminary fuse signals FUSE_OUT_SET<0:2> and outputs the second fuse signals FUSE_SET<0:7>.

Since the select signal SEL has a high logic level, the selecting section 225 shown in FIG. 21 outputs the first through third fuse signals FUSE_LINE<0:5>, FUSE_SET<0:7>, and FUSE_TCM<0:2> as the first through third control signals LINE<0:5>, SET<0:7>, and TCM<0:2>.

The first through third control signals LINE<0:5>, SET<0:7>, and TCM<0:2> are provided to the test mode transfer block 500 through the global lines 410 as shown in FIG. 5.

One latch array 501 is selected according to the first control signals LINE<0:5>, and a certain latch 502 is selected from the latch array 501 according to the second control signals SET<0:7>. The test mode signals TM<0:2> corresponding to the third control signals TCM<0:2> are outputted to the circuit block 30 through the latch 502.

As described above, after the information of the fuse set array 230 is transferred to the circuit block 30, the select signal SEL transits to a low logic level according to the count stop signal STOP, and the count start signal INIT transits to a high logic level.

Referring to FIG. 24, as the mode register signal TMRS for defining a test mode is inputted, the first pulse generation section 212 shown in FIG. 8 generates the first pulse signal TSETE. The reset section 211 transits the test reset signal TRSTPB to a low logic level in response to the reset signal RSTB.

A first address signal set is inputted from an outside of the semiconductor apparatus at the rising edge of the clock signal ICLK. In other words, the address signals MREGI<0:5> are inputted in a state in which the address signal MREGI<6> has a high logic level.

Then, a second address signal set is inputted at the rising edge of the next clock signal ICLK. In other words, the address signals MREGI<0:5> are inputted in a state in which the address signal MREGI<6> has a low logic level.

The first latch section 213 shown in FIG. 8 latches the address signals MREGI<0:6>, which are inputted along with the mode register signal TMRS, and generates the test address signals TMRG<0:6>.

The latch control section 214 activates the latch control signal ADDSET when the test address signal TMRG<6> has a high logic level and activates the latch control signal TCMSET when the test address signal TMRG<6> has a low logic level.

The second latch section 215 latches the test address signals TMRG<0:5> in response to the activated latch control signal ADDSET and outputs the latched signals as the first preliminary control signals PRE_LINE<0:5> in response to the activated latch control signal TCMSET.

The third latch section 216 outputs the test address signals TMRG<0:2> as the third preliminary control signals PRE_TCM<0:2> and the test address signals TMRG<3:5> as the delayed test address signals TMRGD<3:5>, in response to the activated latch control signal TCMSET.

The decoding section 218 outputs the delayed test address signals TMRGD<3:5> as the second preliminary control signals PRE_SET<0:7> in response to the second pulse signal SETPUL.

Namely, the first preliminary control signals PRE_LINE<0:5> are generated according to the address signals MREGI<0:5> inputted with the address signal MREGI<6> having a high logic level, and the second preliminary control signals PRE_SET<0:7> and the third preliminary control signals PRE_TCM<0:2> are generated according to the address signals MREGI<0:5> inputted with the address signal MREGI<6> having a low logic level.

The first through third preliminary control signals PRE_LINE<0:5>, PRE_SET<0:7>, and PRE_TCM<0:2> are outputted as the latch control signal TCMSET is activated.

Since the select signal SEL has a low logic level, the selecting section 225 shown in FIG. 21 outputs the first through third preliminary control signals PRE_LINE<0:5>, PRE_SET<0:7>, and PRE_TCM<0:2> as the first through third control signals LINE<0:5>, SET<0:7>, and TCM<0:2>.

The first through third control signals LINE<0:5>, SET<0:7> and TCM<0:2> are provided to the test mode transfer block 500 through the global lines 410 as shown in FIG. 5.

One latch array 501 is selected according to the first control signals LINE<0:5>, and a certain latch 502 is selected from the latch array 501 according to the second control signals SET<0:7>. The test mode signals TM<0:2> corresponding to the third control signals TCM<0:2> are outputted to the circuit block 30 through the latch 502.

As described above, in the disclosed embodiment, test modes can be defined by decoding the address signals MREGI<0:5> for each of the cases in which the address signal MREGI<6> has a high logic level and a low logic level. That is, while the maximum of only 128 ($2^7$) test modes can be defined as the address signals MREGI<0:6> in the conventional art, the present disclosed embodiments may allow approximately 4,000 ($2^{12}$) test modes to be defined.

Also, the fuse set array 230 can be disposed in the region of the test mode control block 200 and does not necessarily correspond one-to-one with circuit blocks 30. Instead, the fuse set array 230 can be used in such a way as to allocate an optional fuse set of fuse sets to a circuit block that may require a test mode.

As is apparent from the above descriptions, in various exemplary embodiments, by using a decoding method, the number of test modes can be increased, and the number of global lines can be decreased. Further, because selective use of fuses, which is different from one-to-one correspondence, is enabled, the number of fuse sets can be decreased.

Moreover, since fuse sets can be concentratedly disposed in a specified region, circuit design can be easily implemented.

While certain embodiments have been described above, it will be understood to those skilled in the art that the embodiments described are by way of example only. Accordingly, the test mode control circuit of a semiconductor apparatus and the control method thereof described herein should not be limited based on the described embodiments. Rather, the test mode control circuit of a semiconductor apparatus and the control method thereof described herein should only be limited in light of the claims that follow when taken in conjunction with the above description and accompanying drawings.

What is claimed is:

1. A test mode control circuit of a semiconductor apparatus, comprising:
   a test mode control block configured to generate a plurality of preliminary control signal sets in response to a first address signal set and a second address signal set which are sequentially inputted, and output one set of the plurality of preliminary control signal sets and a plurality of fuse signal sets, as a plurality of control signal sets, in response to a test reset signal;
   a test mode transfer block configured to transfer a plurality of test mode signals, which are generated according to a combination of the plurality of control signal sets, to one of a plurality of circuit blocks of the semiconductor apparatus; and
   a fuse set array configured to output the plurality of fuse signal sets in response to count signals.

2. The test mode control circuit according to claim 1, wherein the test mode control block is configured to generate a portion of the plurality of control signal sets in response to the first address signal set and generate a remaining portion of the plurality of control signal sets in response to the second address signal set.

3. The test mode control circuit according to claim 1, wherein the test mode transfer block comprises a plurality of latch arrays, each of the latch arrays comprising a plurality of latches, and the plurality of latches are coupled with the plurality of circuit blocks of the semiconductor apparatus.

4. The test mode control circuit according to claim 3, wherein the plurality of control signal sets comprises a first control signal set, a second control signal set, and a third control signal set.

5. The test mode control circuit according to claim 4, further comprising:
   a plurality of global lines configured to transmit the first control signal set to the test mode transfer block; and
   a decoding logic connected with the global lines and configured to decode the first control signal set and output the decoded first control signal set to the test mode transfer block.

6. The test mode control circuit according to claim 4, wherein one of the plurality of latch arrays is selected in response to the first control signal set, and one of the plurality of latches of the latch array is selected in response to the second control signal set.

7. The test mode control circuit according to claim 1, wherein the test mode control block comprises:
   a test mode generation unit configured to generate first preliminary control signals in response to the first address signal set and generate second preliminary control signals and third preliminary control signals in response to the second address signal set; and
   a test mode control unit configured to output one of: (i) a signal set comprising the first through third preliminary control signals, and (ii) a signal set comprising first through third fuse signals, as first through third control signals, in response to a select signal.

8. The test mode control circuit according to claim 7, wherein the test mode generation unit comprises:
   a reset section configured to generate the test reset signal in response to a reset signal and a specified combination of the first through third control signals;
   a first latch section configured to generate test address signals in response to address signals, and a mode register signal;
   a latch control section configured to generate latch control signals in response to the test address signals;
   a second latch section configured to generate the first preliminary control signals in response to the latch control signals, the test address signals and the test reset signal;
   a third latch section configured to generate the third preliminary control signals and delayed test address signals in response to the latch control signals, the test address signals and the test reset signal;
   a pulse generation section configured to generate a pulse signal in response to the latch control signals and the test reset signal; and a decoding section configured to decode the delayed test address signals in response to the pulse signal and generate the second preliminary control signals.

9. The test mode control circuit according to claim 7, wherein the test mode control unit comprises:
   a fuse operation initializing section configured to generate a fuse clock signal and the select signal in response to the test reset signal and a clock signal;
   a counting section configured to generate the count signals in response to the fuse clock signal;
   a decoding section configured to generate the second fuse signals in response to the fuse clock signal and preliminary fuse signals; and
   a selecting section configured to output one of: (i) the signal set comprising the first through third preliminary control signals, and (ii) the signal set comprising the first through third fuse signals, as the first through third control signals, in response to the select signal.

10. The test mode control circuit according to claim 1, wherein the fuse set array comprises a plurality of fuse sets, and each of the fuse sets comprises a fuse array, and
   wherein fuse cutting information outputted from fuse arrays of the plurality of fuse sets in response to the count signals is provided to the test mode control block as the first through third fuse signals.

11. A test mode control circuit of a semiconductor apparatus, comprising:
   a test mode control block configured to generate test mode encoding signals in response to address signals;
   a plurality of global lines and a decoding logic configured to decode the test mode encoding signals and generate decoding signals;
   a test mode transfer block configured to transfer test mode signals to one of a plurality of circuit blocks corresponding to the decoding signals among a plurality of circuit blocks of the semiconductor apparatus, and
   a fuse set array configured to output second test mode encoding signals which are stored in advance, in response to count signals.

12. The test mode control circuit according to claim 11, wherein the test mode control block is configured to select either the test mode encoding signals or the second test mode encoding signals in response to a test reset signal and provide the selected signals to the global lines and the decoding logic.

13. The test mode control circuit according to claim 11, wherein the test mode transfer block comprises a plurality of latch arrays, each of the latch arrays comprising a plurality of latches, and the plurality of latches are connected with the plurality of circuit blocks of the semiconductor apparatus.

14. The test mode control circuit according to claim 11, wherein the test mode control block is configured to output, as the test mode encoding signals, preliminary encoding signals generated in response to a first address signal set and a second address signal set which are sequentially inputted.

15. The test mode control circuit according to claim 11, wherein the fuse set array is disposed adjacent to the test mode control block.

16. The test mode control circuit according to claim 11, wherein the fuse set array comprises a plurality of fuse sets, and each of the fuse sets is configured to store one bit of entire signal bits of the second test mode encoding signals.

17. A test mode control circuit of a semiconductor apparatus, comprising:
   a test mode control block configured to generate a plurality of control signal sets using an address signal set which is inputted at least two times sequentially; and
   a test mode transfer block configured to transfer a plurality of test mode signals, which are generated according to a combination of the plurality of control signal sets, to a plurality of circuit blocks of the semiconductor apparatus,
   wherein a portion of the plurality of control signal sets are generated when one bit of the address signal has logic high level, and a remaining portion of the plurality of control signal sets are generated when the one bit of the address signal has logic low level.

18. The test mode control circuit according to claim 17, wherein the test mode transfer block comprises a plurality of latch arrays, each of the latch arrays comprising a plurality of latches, and the plurality of latches are connected with the plurality of circuit blocks of the semiconductor apparatus.

19. The test mode control circuit according to claim 17, wherein the test mode transfer block comprises a plurality of latch arrays, each of the latch arrays comprising a plurality of latches, and the plurality of latches are connected with the plurality of circuit blocks of the semiconductor apparatus,
   wherein a latch array of the plurality of latch arrays is selected according to the portion of the plurality of control signal sets, and a latch of the latch array is selected according to the remaining portion of the plurality of control signal sets.

20. The test mode control circuit according to claim 17, further comprising a decoding logic connected with global lines and configured to decode and output the portion of the plurality of control signal sets to the test mode transfer block.

* * * * *